(12) United States Patent
Tai

(10) Patent No.: US 11,194,257 B2
(45) Date of Patent: Dec. 7, 2021

(54) EXPOSURE METHOD, EXPOSURE APPARATUS, METHOD OF MANUFACTURING ARTICLE, AND MEASUREMENT METHOD

(71) Applicant: CANON KABUSHIKI KAISHA, Tokyo (JP)

(72) Inventor: Masaki Tai, Sakura (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/433,229

(22) Filed: Jun. 6, 2019

(65) Prior Publication Data
US 2019/0377269 A1    Dec. 12, 2019

(30) Foreign Application Priority Data

Jun. 11, 2018  (JP) .............................. JP2018-111245

(51) Int. Cl.
*G03F 7/20*    (2006.01)
*G03F 9/00*    (2006.01)

(52) U.S. Cl.
CPC ...... *G03F 7/70358* (2013.01); *G03F 7/70691* (2013.01); *G03F 9/7026* (2013.01)

(58) Field of Classification Search
CPC ............. G03F 7/70775; G03F 7/70641; G03F 9/7026; G03F 7/7085; G03F 7/70666; G03F 7/70716; G03F 9/70; G03F 9/7084; G03F 7/20; G03F 9/7003; G03F 2009/005; G03F 1/44; G03F 9/7034; G03F 7/707; G03F 7/706; G03F 7/70758; G03F 9/7023; G03F 7/70358; G03F 7/70691; G03F 7/70483; G03F 7/2002; H01L 21/68; H01L 21/67288; H01L 22/12; H01L 2224/0401; H01L 2224/16146; H01L 2224/16227; H01L 2225/06513; H01L 2225/06517; H01L 2924/3511; H01L 2224/75753; H01L 27/14687

See application file for complete search history.

(56) References Cited

U.S. PATENT DOCUMENTS

| 6,081,614 A | 6/2000 | Yamada et al. |
| 2015/0192867 A1* | 7/2015 | Imai ...................... G03F 9/7026 355/55 |

(Continued)

FOREIGN PATENT DOCUMENTS

JP    H0945608 A    2/1997

*Primary Examiner* — Mesfin T Asfaw
(74) *Attorney, Agent, or Firm* — Rossi, Kimms & McDowell LLP

(57) ABSTRACT

The present invention provides an exposure method of exposing a substrate while moving an original and the substrate in a scanning direction, the method including performing a step of specifying a position of a concave-convex portion present in the substrate, and performing a step of driving the substrate, based on the position of the concave-convex portion specified and a measurement value of the position in the height direction of each measurement point obtained by causing a light beam to obliquely enter each of a plurality of measurement points while moving the substrate in the scanning direction, so that the position in the height direction of the substrate will be a target position, when exposing the substrate.

10 Claims, 7 Drawing Sheets

(56) References Cited

U.S. PATENT DOCUMENTS

2015/0220004 A1* 8/2015 Takeuchi .............. G03F 9/7026
                                                    355/67
2018/0143542 A1* 5/2018 Hirai ....................... H01L 24/19
2020/0057390 A1* 2/2020 Butler ................... G03F 9/7096

* cited by examiner

EXPOSURE METHOD, EXPOSURE APPARATUS, METHOD OF MANUFACTURING ARTICLE, AND MEASUREMENT METHOD

BACKGROUND OF THE INVENTION

Field of the Invention

The present invention relates to an exposure method, an exposure apparatus, a method of manufacturing an article, and a measurement method.

Description of the Related Art

An exposure apparatus that includes a projection optical system for projecting a pattern of an original to a substrate is used when a device such as a semiconductor device such as an IC or an LSI, a liquid crystal display device, an imaging device such as a CCD, an electromagnetic head, or the like is to be manufactured. To accurately transfer the pattern of the original to a substrate in an exposure apparatus, it is important to determine a reference plane that is hardly influenced by the surface shape of the substrate and arrange the reference plane highly accurately on an imaging plane of the projection optical system.

In a step-and-scan exposure apparatus (scanner), a substrate which is held by a substrate stage is exposed while the substrate stage which holds the substrate is driven in a scanning direction. During this operation, the distance between the imaging plane of a projection optical system and the reference plane of a substrate is measured by a focus sensor, and a tracking and driving operation of sequentially adjusting and matching the reference plane with the imaging plane is performed by driving the substrate stage in a direction perpendicular to the imaging plane. Such a tracking and driving operation requires a focus sensor (preliminary read sensor) to measure in advance (read preliminarily) the distance between the imaging plane of the projection optical system and the reference plane of the substrate at the front of the exposure position while the substrate stage is scanned.

In the tracking and driving operation, it is assumed basically that the surface shape of the substrate will be flat. On the other hand, in recent years, a substrate is often formed by a multi-layer pattern. Since the surface (underlayer) of such a substrate will have a step structure which includes many concave-convex portions, driving the substrate stage so as to track the concave-convex portions will cause a tracking error due to an abrupt change in the driving amount of the substrate stage and cause the focus accuracy to degrade.

Hence, in order to apply the tracking and driving operation to a substrate which has a step structure, measures are required for the concave-convex portions of the surface. To improve the performance of the tracking and driving operation on a substrate with a step structure, Japanese Patent Laid-Open No. 9-45608 proposes a technique of suppressing an abrupt change in the driving amount of a substrate stage by managing, for each measurement point, a measurement offset value with respect the reference plane which is generated by the concave-convex portions.

However, since an oblique incidence focus sensor is used in an exposure apparatus in general, each measurement point will shift in a horizontal direction when a distance (position in the focus direction) from the focus sensor to a substrate changes. Therefore, if the measurement offset value is obtained at a given position in the focus direction in the manner of the related art, a tracking error will occur when the position in the focus direction changes because the measurement offset value with respect to the reference plane generated by the concave-convex portions will not be correctly reflected due to the shifting of the measurement point. In this manner, the related art does not provide an effective means for suppressing the degradation of focus accuracy against the influence of the shifting of a measurement point.

SUMMARY OF THE INVENTION

The present invention provides an exposure method advantageous in the point of focus accuracy.

According to one aspect of the present invention, there is provided an exposure method of exposing a substrate while moving an original and the substrate in a scanning direction, the method including performing a first step of positioning the substrate at each of a plurality of positions in a height direction of the substrate and obtaining, for each of the plurality of positions, a first measurement value of the position in the height direction of each of a plurality of measurement points on the substrate by causing a light beam to obliquely enter each of the plurality of measurement points on the substrate while moving the substrate in the scanning direction, performing a second step of specifying, based on the first measurement value of each measurement point at each of the plurality of positions obtained in the first step, a position of a concave-convex portion present in the substrate by obtaining a surface shape of the substrate, and performing a third step of driving the substrate, based on the position of the concave-convex portion specified in the second step and a second measurement value of the position in the height direction of each measurement point obtained by causing the light beam to obliquely enter each of the plurality of measurement points while moving the substrate in the scanning direction, so that the position in the height direction of the substrate will be a target position, when exposing the substrate.

Further aspects of the present invention will become apparent from the following description of exemplary embodiments with reference to the attached drawings.

DESCRIPTION OF THE EMBODIMENTS

Figure 1:
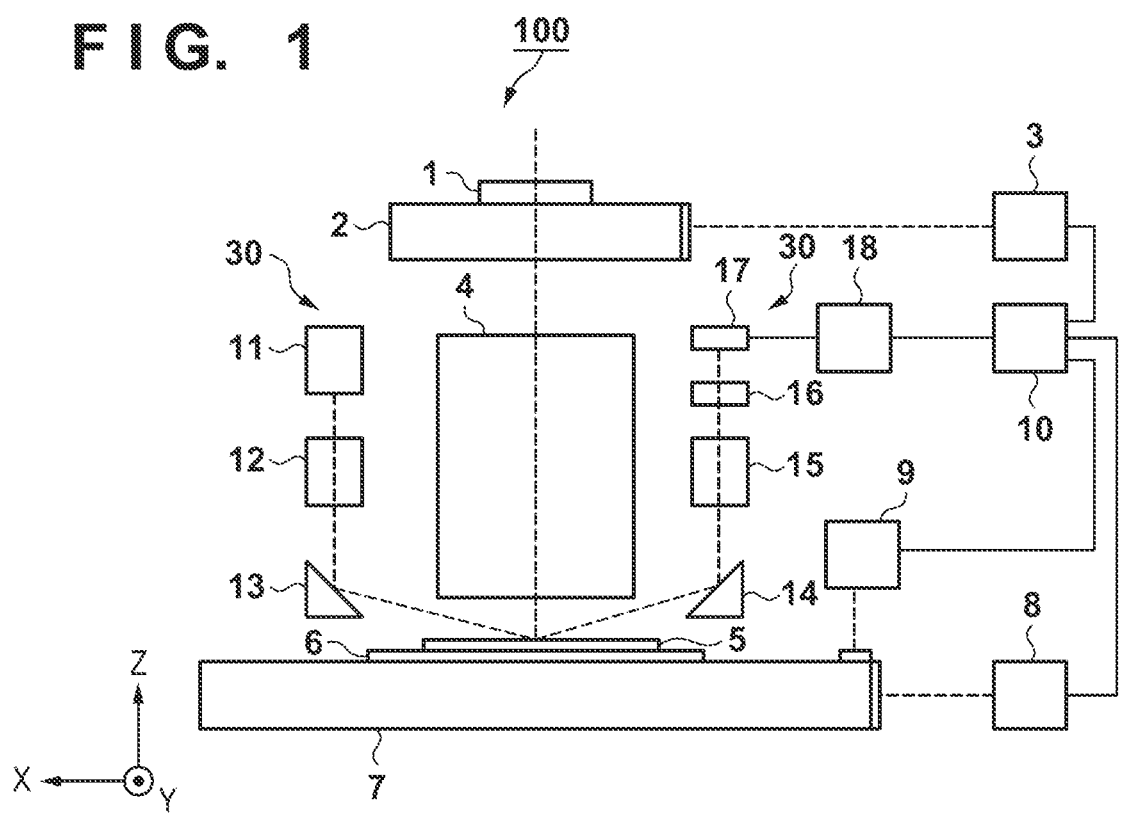
FIG. 1 is a schematic view showing the arrangement of an exposure apparatus as an aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the arrangement of an exposure apparatus 100 as one aspect of the present invention. The exposure apparatus 100 is a step-and-scan exposure apparatus (scanner) that transfers a pattern of an original 1 onto a substrate by exposing (performing a scanning exposure operation on) a substrate 5 while moving the original 1 and the substrate 5. The exposure apparatus 100 includes, as shown in FIG. 1, an original stage 2, a first measurement unit 3, a projection optical system 4, a substrate holder 6, a substrate stage 7, a second measurement unit 8, a third measurement unit 9, a control unit 10, and a focus measurement unit 30.

In addition, in the embodiment, directions will be indicated by an XYZ coordinate system in which directions parallel to the surface of the substrate 5 are set as the X-Y plane. Assume that directions parallel to the X-axis, the Y-axis, and the Z-axis of the XYZ coordinate system are the X direction, the Y direction, and the Z direction, respectively. Assume that θX, θY, and θZ, indicate a rotation about the X-axis, a rotation about the Y-axis, and a rotation about the Z-axis, respectively.

The original stage 2 holds the original 1 in which a fine pattern to be transferred to the substrate 5 is formed. The original stage 2 includes, for example, a chucking unit (not shown) for chucking the original 1, and holds the original 1 by vacuum chucking the original 1 by the chucking unit. The original stage 2 includes an actuator (not shown) to move in the Y direction, and a linear motor is mainly used as the actuator.

The first measurement unit 3 includes, for example, an interferometer or an optical linear encoder, and measures the position of the original stage 2 in the Y direction. Also, to allow tilt control to be performed on the original stage 2, the first measurement unit 3 obtains the tilt component of the original stage 2 by measuring at least three positions on a measurement surface provided on a side surface of the original stage 2. Each position of the original stage 2 measured by the first measurement unit 3 is input to the control unit 10.

The original 1 held by the original stage 2 is illuminated by an illumination optical system (not shown). An image of the pattern of the original 1 is reduced by the projection optical system 4 and transferred to the substrate 5.

The substrate stage 7 holds the substrate 5 via the substrate holder 6. The substrate stage 7 includes a chucking unit (not shown) for chucking (vacuum chucking) the substrate 5 and the substrate holder 6. Both the substrate-stage-side surface and the substrate-side surface of the substrate holder 6 have been flattened to reduce the concave-convex portions of the substrate 5. The substrate holder 6 is also formed by a material with high temperature stability, such as a ceramic, to reduce deformation due to temperature change. The substrate stage 7 includes an actuator to move in X, Y, and Z directions, and a linear motor or a voice coil motor is used as the actuator.

The second measurement unit 8 measures the position of the substrate stage 7 in the X direction and the Y direction. The third measurement unit 9 measures the position of the substrate stage 7 in the Z direction. In addition, in a similar manner to the original stage 2, the second measurement unit 8 measures at least three positions on a measurement surface provided on a side surface of the substrate stage 7 to allow tilt control to be performed on the substrate stage 7. Each position of the substrate stage 7 measured by the second measurement unit 8 and the third measurement unit 9 is input to the control unit 10.

The control unit 10 is formed of a computer including a CPU, a memory, and the like, and causes the exposure apparatus 100 to operate by integrally controlling the units of the exposure apparatus 100 in accordance with a program stored in a storage unit. The control unit 10 controls the original stage 2 and the substrate stage 7 to transfer a pattern to each of a plurality of shot regions on the substrate. In addition, to accurately form an image of the pattern, the control unit 10 obtains information related to the distance between the imaging plane of the projection optical system 4 and the substrate 5, the tilt, and the reference plane of the substrate 5 from the focus measurement unit 30 while performing a scanning exposure operation. The control unit 10 subsequently drives the substrate stage 7 in the Z direction to perform a tracking and driving operation of sequentially adjusting and matching the reference plane of the substrate 5 with the image forming plane of the projection optical system 4.

The focus measurement unit 30 includes a light source 11, a projection lens 12, reflecting mirrors 13 and 14, a light receiving lens 15, a cylindrical lens 16, line sensors 17, and an arithmetic processing unit 18. The light from the light source 11 is projected to a slit (not shown). The light beams (projection marks formed by the slit) from the slit are incident (obliquely incident) on a plurality of positions on the substrate 5, via the projection lens 12 and the reflecting mirror 13, at a predetermined angle. The light beams reflected by the substrate 5 enter the cylindrical lens 16 via the reflecting mirror 14 and the light receiving lens 15. The projection lens 12 and the light receiving lens 15 are made of telecentric lenses. The light beams that entered the cylindrical lens 16 are integrated one-dimensionally, and the line sensors 17 obtain the pieces of light intensity information at pixel positions. Each line sensor 17 is formed by a CCD, a CMOS sensor, or the like, and detects the light reflected by the substrate 5. The plurality of line sensors 17 are arranged in accordance with the number of projection marks formed by the slit. The arithmetic processing unit 18 calculates the distance between the focus measurement unit 30 and the substrate 5, the tilt, the reference plane of the substrate 5 based on the pieces of light intensity information obtained by the line sensors 17, and inputs the calculation result to the control unit 10.

Figure 2:
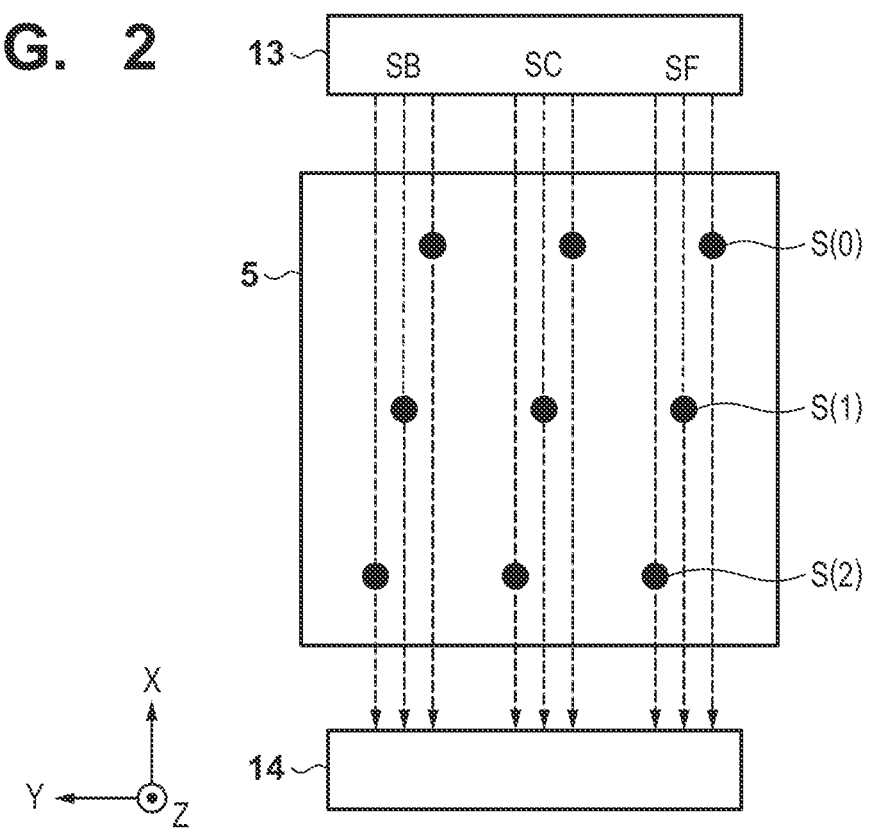
FIG. 2 is a view showing the positional relationship between a substrate and measurement light beams of a focus measurement unit.

FIG. 2 is a view showing the positional relationship between the substrate 5 and measurement light beams (light beams reflected by the reflecting mirror 13 and incident on the substrate 5) of the focus measurement unit 30. The exposure apparatus 100 exposes the substrate 5 while scanning (driving) the substrate 5 back and forth in the scanning direction (Y direction). Hence, the focus measurement unit 30 causes a measurement light beam SC for measuring the focus at an exposure position (exposure region) and measurement light beams SF and SB for measuring (reading ahead) the focus at positions apart from the exposure position with respect to the scanning direction to be incident on the substrate 5. The focus here includes a position in the height direction of the substrate 5, for example, the distance between the imaging plane of the projection optical system 4 and the reference plane of the substrate 5.

Figure 3A:
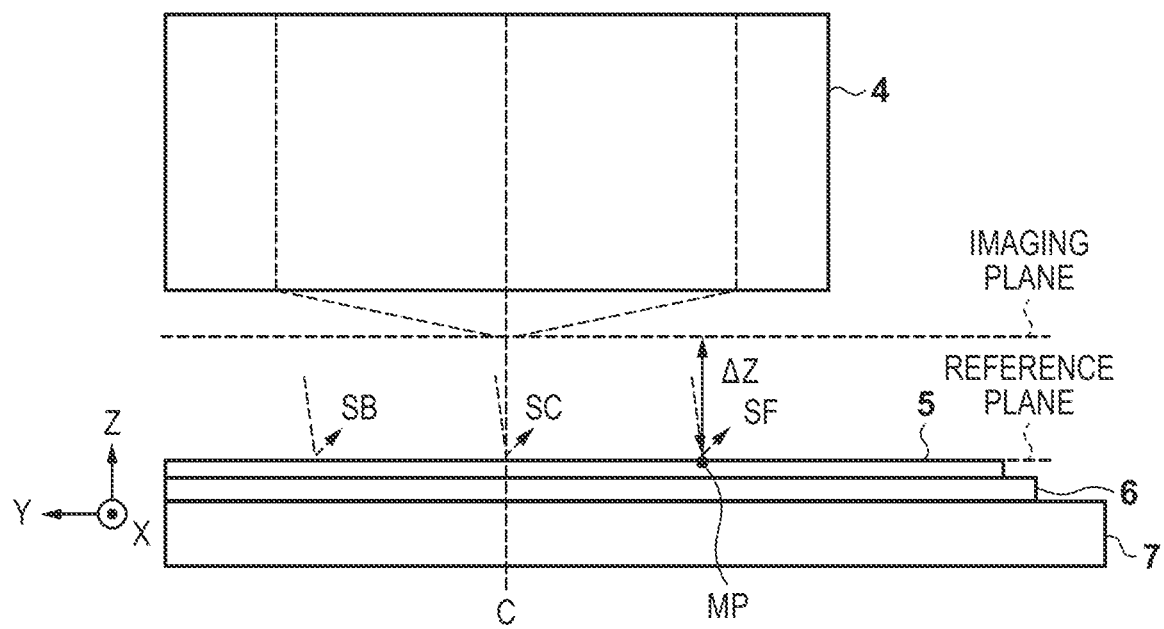
FIGS. 3A and 3B are views each showing a positional relationship between an imaging plane of a projection optical system, a reference plane of the substrate, and the measurement light beams.
Figure 3B:
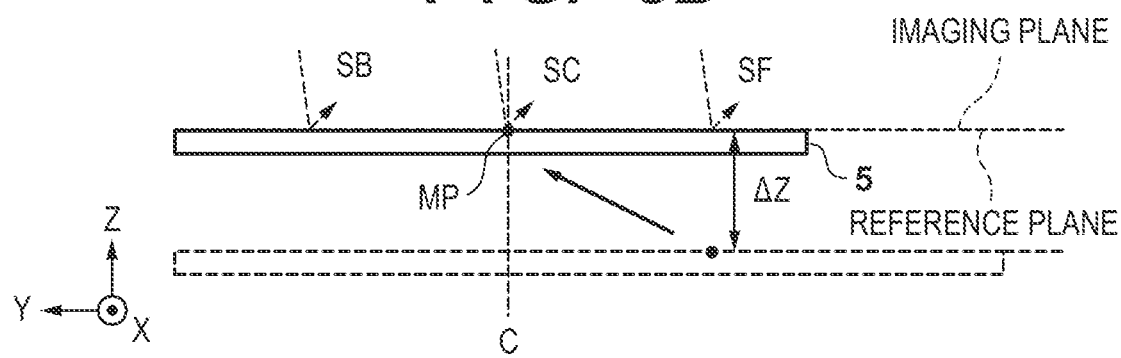

FIGS. 3A and 3B are views each showing the positional relationship between the imaging plane of the projection optical system 4, the reference plane of the substrate 5, and the measurement light beams SC, SF, and SB. FIGS. 3A and 3B show a state during an exposure scanning operation, and it is assumed that the substrate stage 7 is scanned in the +Y direction (direction perpendicular to the height direction (Z direction) of the substrate 5) and the measurement light beam SF is used to perform the preliminary read measurement.

As shown in FIG. 3A, during the scanning of the substrate stage 7, a distance $\Delta Z$ between the imaging plane of the projection optical system 4 and the reference plane of the substrate 5 is measured by the measurement light beam SF. Subsequently, as shown in FIG. 3B, the substrate stage 7 is driven in the +Z direction for only the distance $\Delta Z$ until a measurement point MP on the substrate measured by the measurement light beam SF reaches an exposure position C, and exposure is started when the measurement point MP has reached the exposure position C. In addition, a focusing error at the exposure position C is measured by the measurement light beam SC simultaneously with the exposure of the measurement point MP on the substrate. A scanning exposure operation can be performed by performing these operations continuously while changing the position of the measurement point on the substrate.

Figure 4:
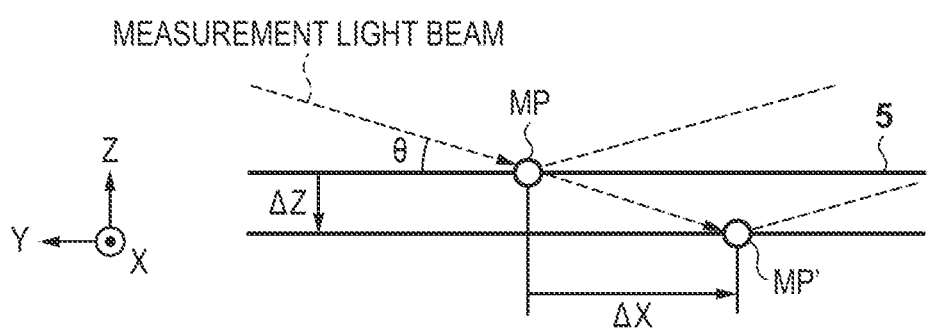
FIG. 4 is a view for explaining the shifting of a measurement point on the substrate.

Since the focus measurement unit 30 is an oblique incidence focus sensor, if the distance between the focus measurement unit 30 and the substrate 5 changes as shown in FIG. 4, the measurement point on the substrate will shift in the X direction. For example, if the position of the substrate 5 changes in a −Z direction by the distance $\Delta Z$ in a case in which the measurement light beam enters the substrate 5 from the +X direction at an incidence angle θ, the measurement point MP will shift by $\Delta X$ ($=\Delta Z/\tan\theta$) in the −X direction as shown by a measurement point MP'.

Figure 5A:
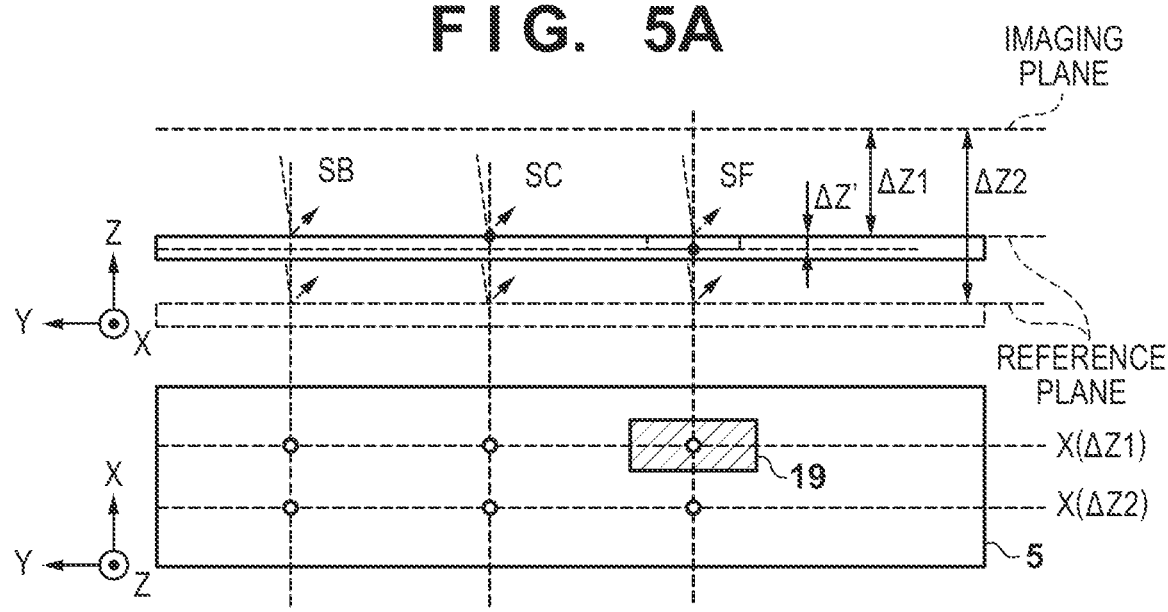
FIGS. 5A and 5B are views each showing a positional relationship between the imaging plane of the projection optical system, the reference plane of the substrate, and the measurement light beams.
Figure 5B:
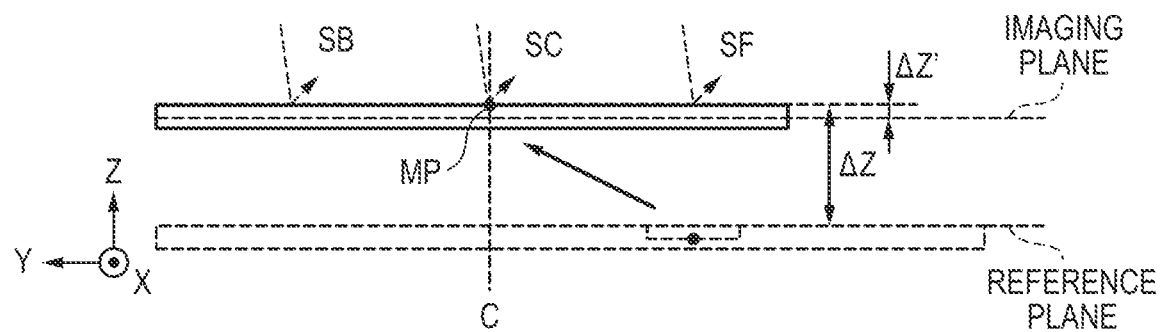

FIGS. 5A and 5B are views for explaining in detail the shifting of a measurement point on the substrate, and show the positional relationship between the imaging plane of the projection optical system 4, the reference plane of the substrate 5, and the measurement light beams SC, SF, and SB. FIGS. 5A and 5B show a state during an exposure scanning operation, and it is assumed that the substrate stage 7 is scanned in the +Y direction and the measurement light beam SF is used to perform the preliminary read measurement.

As shown in FIG. 5A, the measurement point on the substrate in a case in which a distance $\Delta Z1$ is the distance between the imaging plane of the projection optical system 4 and the reference plane and that in a case in which a distance $\Delta Z2$ is the distance between the imaging plane of the projection optical system 4 and reference plane differ as shown by reference symbols X ($\Delta Z1$) and X ($\Delta Z2$), respectively. Here, consider a case in which a measurement offset value of the reference plane that is generated by a concave-convex portion (step) 19 of the substrate 5 is to be obtained in the manner of the related art. For example, assume that the measurement offset value is to be obtained by using the distance $\Delta Z2$ between the imaging plane of the projection optical system 4 and the reference plane. In this case, if the tracking and driving operation is performed from the distance $\Delta Z1$ between the imaging plane of the projection optical system 4 and the reference plane, a measurement offset value $\Delta Z'$ of the concave-convex portion 19 of the substrate 5 is not reflected, and an error will occur in the driving amount $\Delta Z$ of the substrate stage 7 as shown in FIG. 5B. In addition, an error will also occur in the driving amount $\Delta Z$ of the substrate stage 7 in the same manner when a measurement offset value is obtained by using the distance $\Delta Z1$ between the imaging plane of the projection optical system 4 and the reference plane and the tracking and driving operation is performed from the distance $\Delta Z2$ between the imaging plane of the projection optical system 4 and the reference plane.

Therefore, this embodiment provides a technique advantageous in the point of focus accuracy by implementing a highly accurate tracking and driving operation at the time of a scanning exposure operation even in a case in which the concave-convex portion 19 is present in the substrate 5.

First Embodiment

Figure 6A:
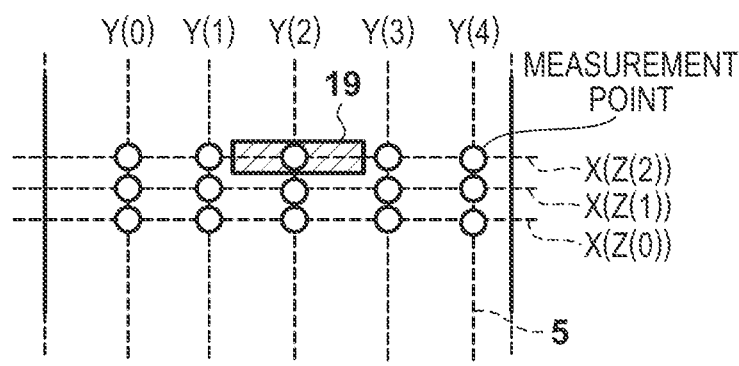
FIGS. 6A to 6D are views showing examples of measurement points on a substrate.

FIG. 6A is a view showing measurement points (white dots) on a substrate to be measured by a focus measurement unit 30 at a plurality of positions in the Z direction of a substrate stage 7 (a substrate 5). Among the measurement points (black dots) corresponding to measurement light beams SF, SC, and SB on the substrate shown in FIG. 2, measurement points that correspond to the measurement light beam SF on the substrate are shown in FIG. 6A.

Figure 6B:
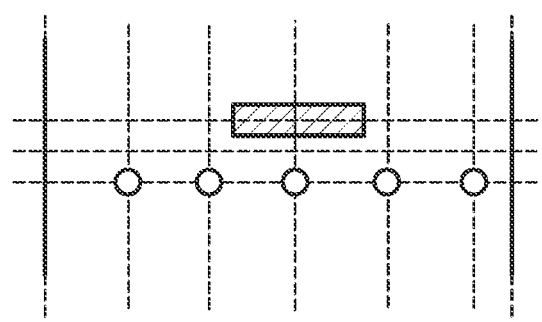

Before the scanning exposure operation is started in this embodiment, the substrate stage 7 (substrate 5) is driven first so that the substrate stage 7 will be positioned at a Z position (a position in the Z direction) Z(0). Subsequently, the focus is measured at each measurement point on the substrate while scanning the substrate stage 7 in the +Y direction. In this case, the measurement points on the substrate at the Z position Z(0) are (Y(0), Z(0)), (Y(1), Z(0)), ..., and (Y(4), Z(0)) as shown in FIG. 6B. In addition, the focus measurement unit 30 obtains measurement values FZ (FZ(Y(0), Z(0)), FZ(Y(1), Z(0)), ..., and FZ(Y(4), Z(0))) corresponding to the respective measurement points.

Figure 6C:
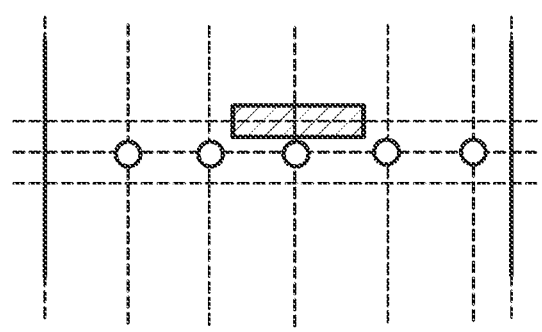

Next, the substrate stage 7 is driven so that the substrate stage 7 will be positioned at a Z position Z(1). Subsequently, the focus is measured at each measurement point on the substrate while scanning the substrate stage 7 in the +Y direction. In this case, the measurement points on the substrate at the Z position Z(1) are (Y(0), Z(1)), (Y(1), Z(1)), ..., and (Y(4), Z(1)) as shown in FIG. 6C. In addition, the focus measurement unit 30 obtains measurement values FZ (FZ(Y(0), Z(1)), FZ(Y(1), Z(1)), ..., and FZ(Y(4), Z(1))) corresponding to the respective measurement points.

Figure 6D:
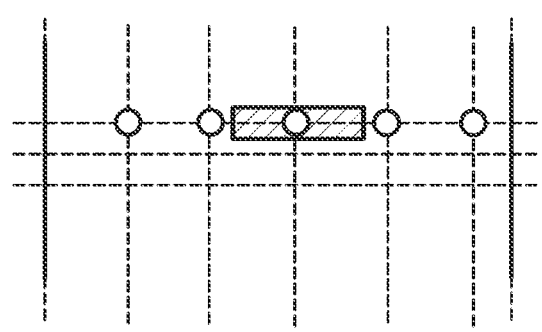

In the same manner, the substrate stage 7 is driven so that the substrate stage 7 will be positioned at a Z position Z(2). Subsequently, the focus is measured at each measurement point on the substrate while scanning the substrate stage 7 in the +Y direction. In this case, the measurement points on the substrate at the Z position Z(2) are (Y(0), Z(2)), (Y(1), Z(2)), ..., and (Y(4), Z(2)) as shown in FIG. 6D. In addition, the focus measurement unit 30 obtains measurement values FZ (FZ(Y(0), Z(2)), FZ(Y(1), Z(2)), ..., and FZ(Y(4), Z(2))) corresponding to the respective measurement points.

In this manner, the measurement points on the substrate shift in the X direction by changing the Z position on the substrate stage 7 (substrate 5). Hence, a plurality of Z positions can be positioned on the substrate 5, and the measurement value FZ of each measurement point can be obtained for each of the plurality of Z positions to specify the position of the concave-convex portion 19 by obtaining the surface shape of the substrate 5 with respect to the Z positions as a reference.

After the measurement value FZ (first measurement value) of each measurement point on the substrate has been obtained for each Z position, a difference ΔFZ (measurement offset value) between the measurement value FZ and the Z position of the substrate stage 7 (substrate 5) is obtained for each measurement point as shown below.

$$\Delta FZ((Y(0), Z(0)) = FZ((Y(0), Z(0)) - Z(0)$$

$$\Delta FZ((Y(1), Z(0)) = FZ((Y(1), Z(0)) - Z(0)$$

...

$$\Delta FZ((Y(4), Z(0)) = FZ((Y(4), Z(0)) - Z(0)$$

$$\Delta FZ((Y(0), Z(1)) = FZ((Y(0), Z(1)) - Z(1)$$

$$\Delta FZ((Y(1), Z(1)) = FZ((Y(1), Z(1)) - Z(1)$$

...

$$\Delta FZ((Y(4), Z(1)) = FZ((Y(4), Z(1)) - Z(1)$$

$$\Delta FZ((Y(0), Z(2)) = FZ((Y(0), Z(2)) - Z(2)$$

$$\Delta FZ((Y(1), Z(2)) = FZ((Y(1), Z(2)) - Z(2)$$

...

$$\Delta FZ((Y(4), Z(2)) = FZ((Y(4), Z(2)) - Z(2)$$

Figure 7A:
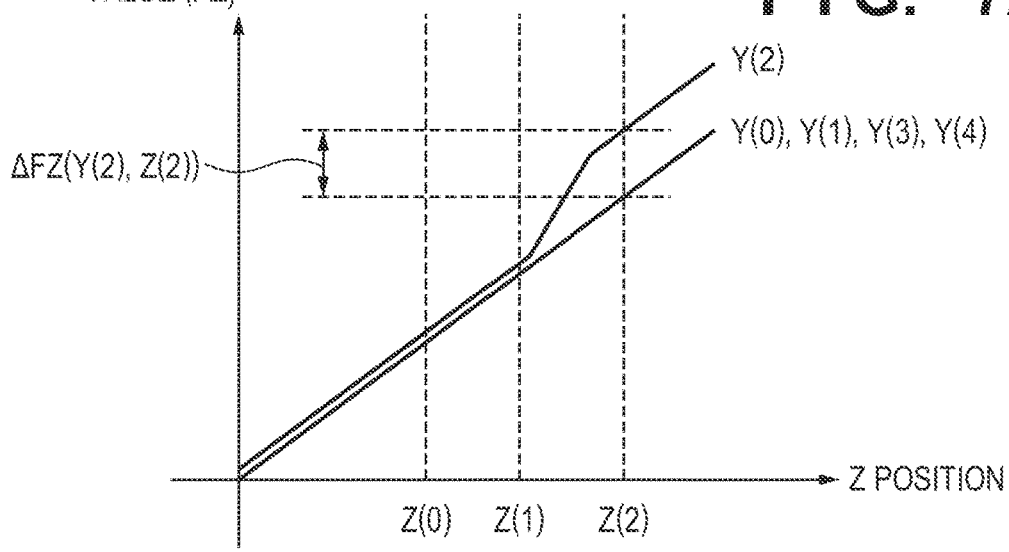
FIGS. 7A and 7B are views for explaining the correction of measurement values of respective measurement points on the substrate.

FIG. 7A is a view showing the relationship between the measurement value FZ of each measurement point on the substrate measured by the focus measurement unit 30 and each Z position on the substrate stage 7 measured by a third measurement unit 9. In FIG. 7A, the ordinate indicates the measurement value FZ of each measurement point on the substrate, and the abscissa indicates the Z position on the substrate stage 7. Referring to FIG. 7A, it can be seen that the measurement value FZ and the Z position linearly change at a measurement point where the shape of the substrate 5 is flat. On the other hand, at a measurement point (Y(2), Z(2)) positioned at a concave-convex portion 19 present in the substrate 5, a difference ΔFZ(Y(2), Z(2)) between a measurement value FZ(Y(2), Z(2)) and the Z position Z(2) is generated.

Figure 7B:
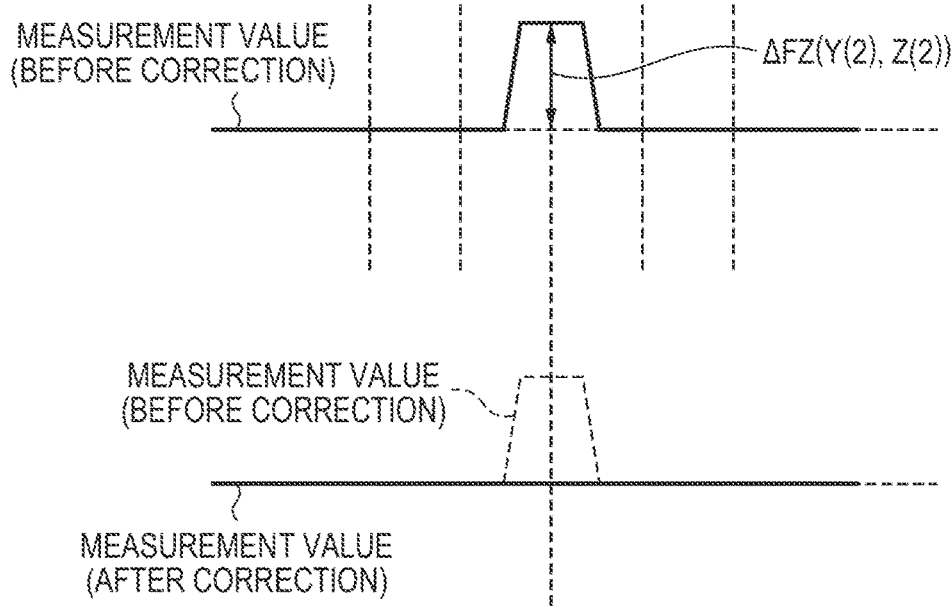

FIG. 7B is a view conceptually showing the correction of the measurement value FZ of each measurement point on the substrate in a case which assumes that the concave-convex portion 19 present at a Y position (a position in the Y direction) Y(2) on the substrate 5 is measured at the time of the scanning exposure operation. The measurement value FZ of each measurement point is corrected based on the difference ΔFZ and the measurement value FZ (second measurement value) obtained by measuring the focus at each measurement point on the substrate after the scanning exposure operation has been started.

For example, consider a case in which the Z position of the substrate stage 7 is positioned near Z(0) when the focus is measured by positioning the substrate stage 7 at each of Y positions Y(0) and Y(1). In this case, as shown below, a value obtained by subtracting the difference ΔFZ of each measurement point (Y(0), Z(0)) and (Y(1), Z(0)) from the measurement value FZ of each measurement point on the substrate is obtained as a corrected measurement value FZ'.

$$FZ'(Y(0),Z(0))=FZ(Y(0),Z(0))-\Delta FZ(Y(0),Z(0))$$

$$FZ'(Y(1),Z(0))=FZ(Y(1),Z(0))-\Delta FZ(Y(1),Z(0))$$

Next, consider a case in which the Z position of the substrate stage 7 is positioned near Z(2) when the focus is measured by positioning the substrate stage 7 at a Y position Y(2). In this case, as shown below, the measurement value FZ is corrected by the difference ΔFZ of the measurement point (Y(2), Z(2)) to obtain the corrected measurement value FZ'.

$$FZ'(Y(2),Z(2))=FZ(Y(2),Z(2))-\Delta FZ(Y(2),Z(2))$$

Although the measurement value FZ(Y(2), Z(2)) includes a measurement error due to the concave-convex portion 19 present in the substrate 5, the measurement error is removed by subtracting the difference ΔFZ(Y(2), Z(2)).

Next, consider a case in which the Z position of the substrate stage 7 is positioned near Z(0) when the focus is measured by positioning the substrate stage 7 at each of Y positions Y(3) and Y(4). In this case, as shown below, a value obtained by subtracting the difference ΔFZ of each measurement point (Y(3), Z(0)) and (Y(4), Z(0)) from the measurement value FZ of each measurement point on the substrate is obtained as the corrected measurement value FZ'.

$$FZ'(Y(3),Z(0))=FZ(Y(3),Z(0))-\Delta FZ(Y(3),Z(0))$$

$$FZ'(Y(4),Z(0))=FZ(Y(4),Z(0))-\Delta FZ(Y(4),Z(0))$$

Therefore, the corrected measurement value FZ' of each measurement point on the substrate is expressed as follows.

$$FZ'(Y(0),Z(0))=FZ(Y(0),Z(0))-\Delta FZ(Y(0),Z(0))$$

$$FZ'(Y(1),Z(0))=FZ(Y(1),Z(0))-\Delta FZ(Y(1),Z(0))$$

$$FZ'(Y(2),Z(2))=FZ(Y(2),Z(2))-\Delta FZ(Y(2),Z(2))$$

$$FZ'(Y(3),Z(0))=FZ(Y(3),Z(0))-\Delta FZ(Y(3),Z(0))$$

$$FZ'(Y(4),Z(0))=FZ(Y(4),Z(0))-\Delta FZ(Y(4),Z(0))$$

According to this embodiment, even if the measurement point on the substrate shifts to the concave-convex portion 19 at the time of a scanning exposure operation, the measurement error can be removed by correcting the measurement value FZ by using the difference ΔFZ obtained before the scanning exposure operation. Note that this kind of correction is performed on each measurement point on the substrate where each of the measurement light beams SF, SC, and SB is to enter as shown in FIG. 2. Therefore, in an exposure apparatus 100, since the tracking and driving operation of sequentially adjusting and matching the substrate 5 (the reference plane) with the imaging plane of a projection optical system 4 by driving the substrate stage 7 in the Z direction can be performed highly accurately when the scanning exposure operation on the substrate 5 is performed, it is possible to prevent the degradation of the focus accuracy.

Second Embodiment

This embodiment will describe a case in which a target position of a substrate stage 7 at the time of the scanning exposure operation is corrected based on a difference ΔFZ obtained before the scanning exposure operation. The surface shape of a substrate 5 needs to be obtained based on measurement values FZ of respective measurement points on the substrate to determine the target position of substrate stage 7.

Figure 8:
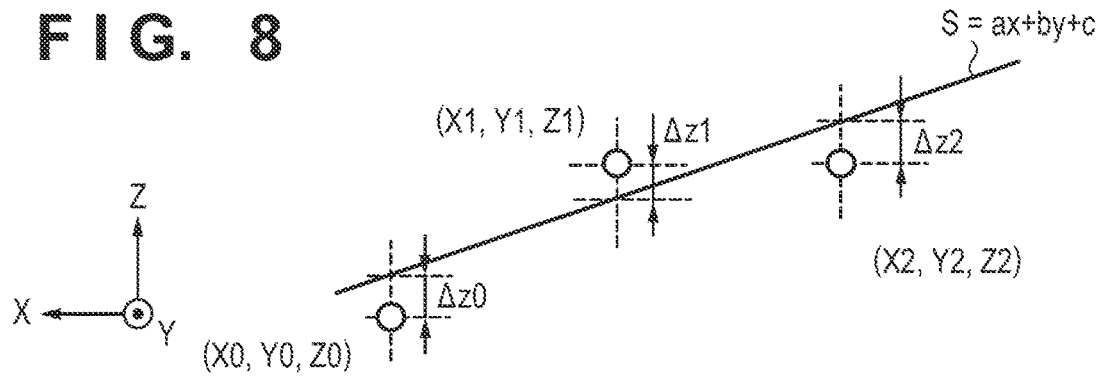
FIG. 8 is a view showing a relationship between measurement points on a substrate and a surface of the substrate.

In general, the least squares method is used to obtain the surface shape of the substrate 5. FIG. 8 is a view showing the relationship between measurement points on the substrate and the surface (surface shape) of the substrate 5. In FIG. 8, assume that the surface of the substrate 5 is a first-order approximate plane. Letting (X0, Y0, Z0), (X1, Y1, Z1), and (X2, Y2, Z2) be measurement points on the substrate, respectively, the approximate plane can be obtained by determining coefficients (a, b, and c) that minimize distances $\Delta z0$, $\Delta z1$, and $\Delta z2$, respectively, between the measurement points and a surface (S=ax+by+c).

Figure 9A:
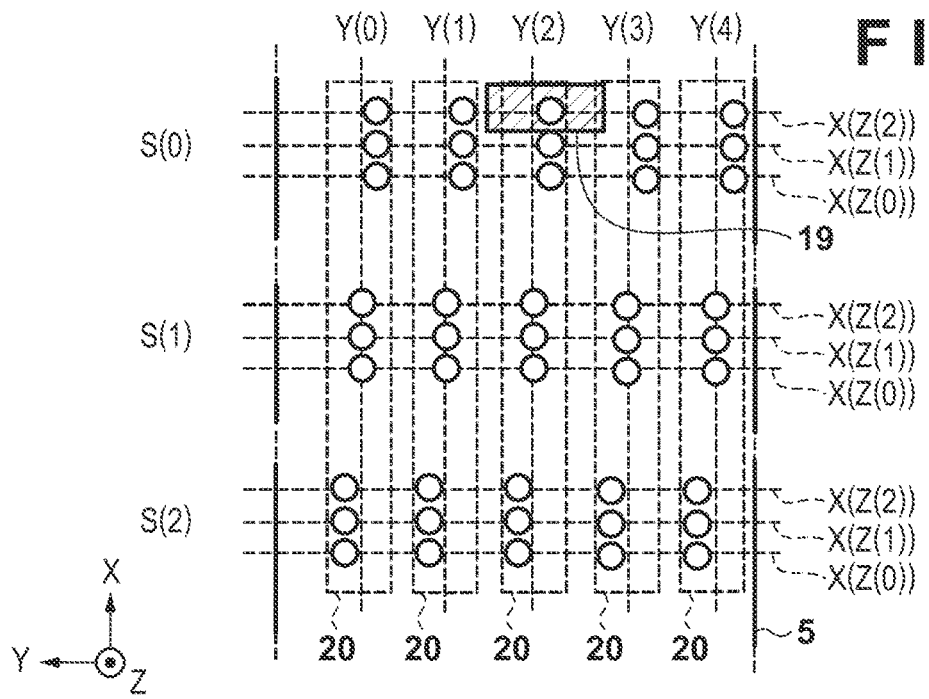
FIGS. 9A to 9C are views for explaining the correction of a target position of the substrate stage.

FIG. 9A is a view showing measurement locations S(0), S(1), and S(2) of a measurement light beam SF shown in FIG. 2. As described above, the substrate stage 7 is driven so that the substrate stage 7 (substrate 5) will be positioned at each of Z positions Z(0), Z(1), and Z(2) before the scanning exposure operation is started. Then, at each Z position, the focus is measured at each of Y positions Y(0), Y(1), Y(2), and Y(3) while scanning the substrate stage 7 in the +Y direction. Next, a surface shape 20 of the substrate 5 is obtained from the measurement values of measurement points (Y(0), Z(0)), (Y(1), Z(1)), . . . , and (Y(4), Z(2)).

Figure 9B:
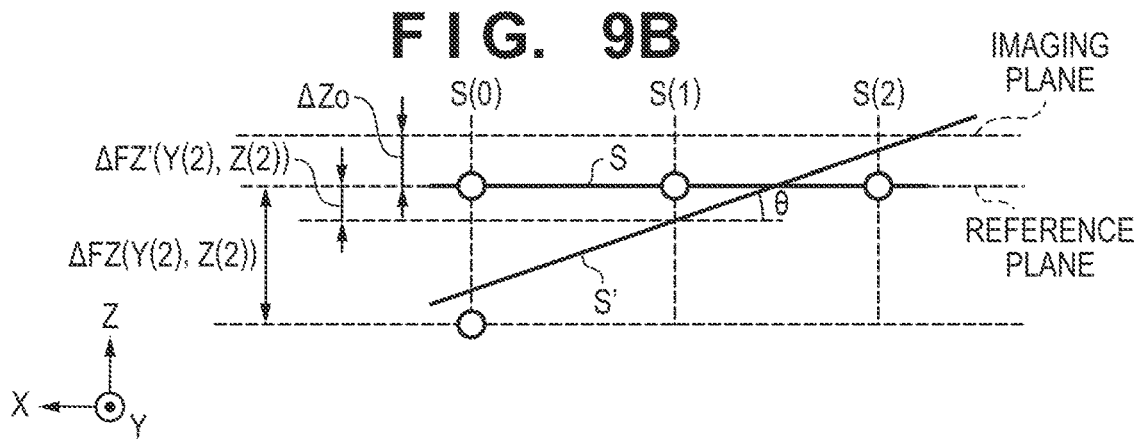

FIG. 9B is a view showing the relationship between a first-order approximate plane at the Y position Y(2), the measurement locations S(0), S(1), and S(2), and the driving amount in the Z direction of the substrate stage 7. Assume that a reference symbol S indicates an approximate plane of the substrate 5 that is obtained from measurement points excluding the measurement point (Y(2), Z(2)). Since the approximate plane S is not influenced by a concave-convex portion 19 present in the substrate 5, it will be used as the reference plane of the substrate 5. Referring to FIG. 9B, it can be seen that the driving amount of the substrate stage 7 is a difference $\Delta Zo$ between the imaging plane of a projection optical system 4 and the reference plane of the substrate 5, and substrate stage 7 is driven in the +Z direction by $\Delta Zo$ at the time of the scanning exposure operation.

On the other hand, since the measurement point (Y(2), Z(2)) is influenced by the concave-convex portion 19 present in the substrate 5, a difference $\Delta FZ(Y(2), Z(2))$ is generated between the measurement value of the measurement location S(0) and the reference plane of the substrate 5. As a result, the approximate plane will be an approximate plane S' including a tilt component $\theta$. In this case, the driving amount of the substrate stage 7 at the Y position Y(2) will be a value obtained by adding a difference $\Delta FZ'(Y(2), Z(2))$ to the difference $\Delta Zo$ between the imaging plane of the projection optical system 4 and the reference plane of the substrate 5.

Figure 9C:
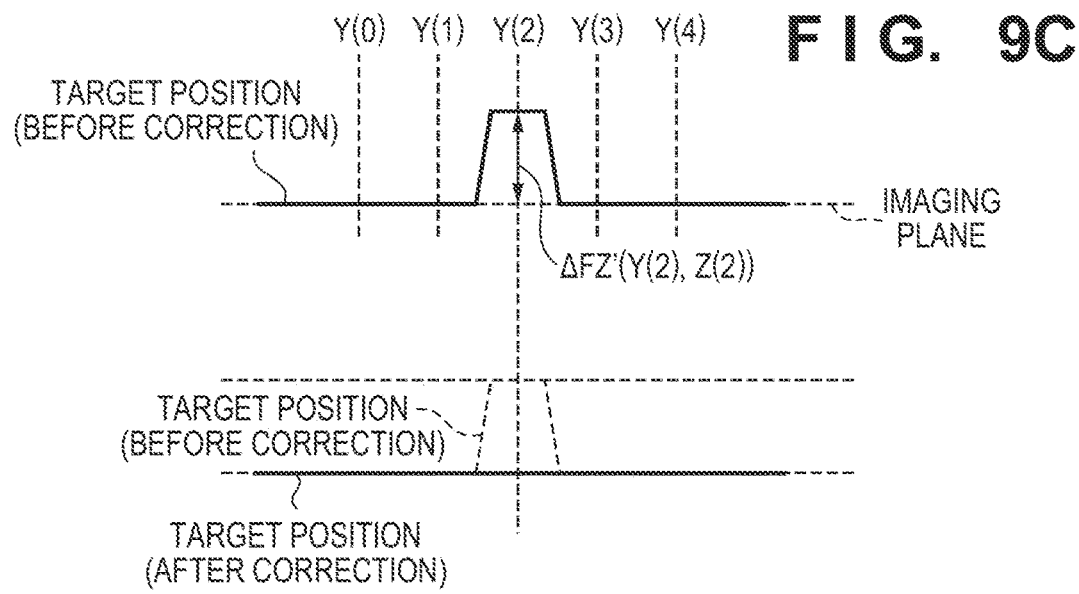

FIG. 9C is a view conceptually showing the correction performed on the target position of the substrate stage 7 to track the imaging plane of the projection optical system 4. Here, letting TZ be the target position of the substrate stage 7, a value obtained by subtracting a difference $\Delta FZ'$ from the target position TZ at each measurement point will be a corrected target position TZ'.

For example, in a case in which the Z position of the substrate stage 7 is Z(0), the target position TZ' of the substrate stage 7 is determined based on each measurement value obtained by measuring the focus at the Z position Z(0) as shown below.

$TZ'(Y(0),Z(0))=TZ(Y(0))-\Delta FZ'(Y(0),Z(0))$ $TZ'(Y(1),Z(0))=TZ(Y(1))-\Delta FZ'(Y(1),Z(0))$ $TZ'(Y(2),Z(0))=TZ(Y(2))-\Delta FZ'(Y(2),Z(0))$ $TZ'(Y(3),Z(0))=TZ(Y(3))-\Delta FZ'(Y(3),Z(0))$ $TZ'(Y(4),Z(0))=TZ(Y(4))-\Delta FZ'(Y(4),Z(0))$ Since the difference $\Delta FZ'$ will be zero when the surface shape 20 of the substrate 5 is flat, the target position TZ at the Y positions Y(0), Y(1), Y(3), and Y(4) and the corrected target position TZ' will match.

The same result as described above is also obtained in a case in which the Z position of the substrate stage 7 is Z(1). On the other hand, in a case in which the Z position of the substrate stage 7 is Z(2), the target position TZ' of the substrate stage 7 is determined as shown below.

$TZ'(Y(0),Z(2))=TZ(Y(0))-\Delta FZ'(Y(0),Z(2))$ $TZ'(Y(1),Z(2))=TZ(Y(1))-\Delta FZ'(Y(1),Z(2))$ $TZ'(Y(2),Z(2))=TZ(Y(2))-\Delta FZ'(Y(2),Z(2))$ $TZ'(Y(3),Z(2))=TZ(Y(3))-\Delta FZ'(Y(3),Z(2))$ $TZ'(Y(4),Z(2))=TZ(Y(4))-\Delta FZ'(Y(4),Z(2))$ In this manner, although an error will occur in the driving amount of the substrate stage 7 at the measurement point (Y(2), Z(2)) on the substrate due to the concave-convex portion 19 present on the substrate 5, the error can be removed by correcting the target position by the difference $\Delta FZ'(Y(2), Z(2))$ obtained before the scanning exposure operation. Therefore, in an exposure apparatus 100, since the tracking and driving operation of sequentially adjusting and matching (the reference plane of) the substrate 5 with the imaging plane of the projection optical system 4 by driving the substrate stage 7 in the Z direction can be performed highly accurately when the scanning exposure operation is performed on the substrate 5, it is possible to prevent the degradation of the focus accuracy. Note that although this embodiment described the correction of the target position of the substrate stage 7 in the Z direction, the present invention is also applicable to the correction of the target position of the tilt of the substrate stage 7.

Figure 10:
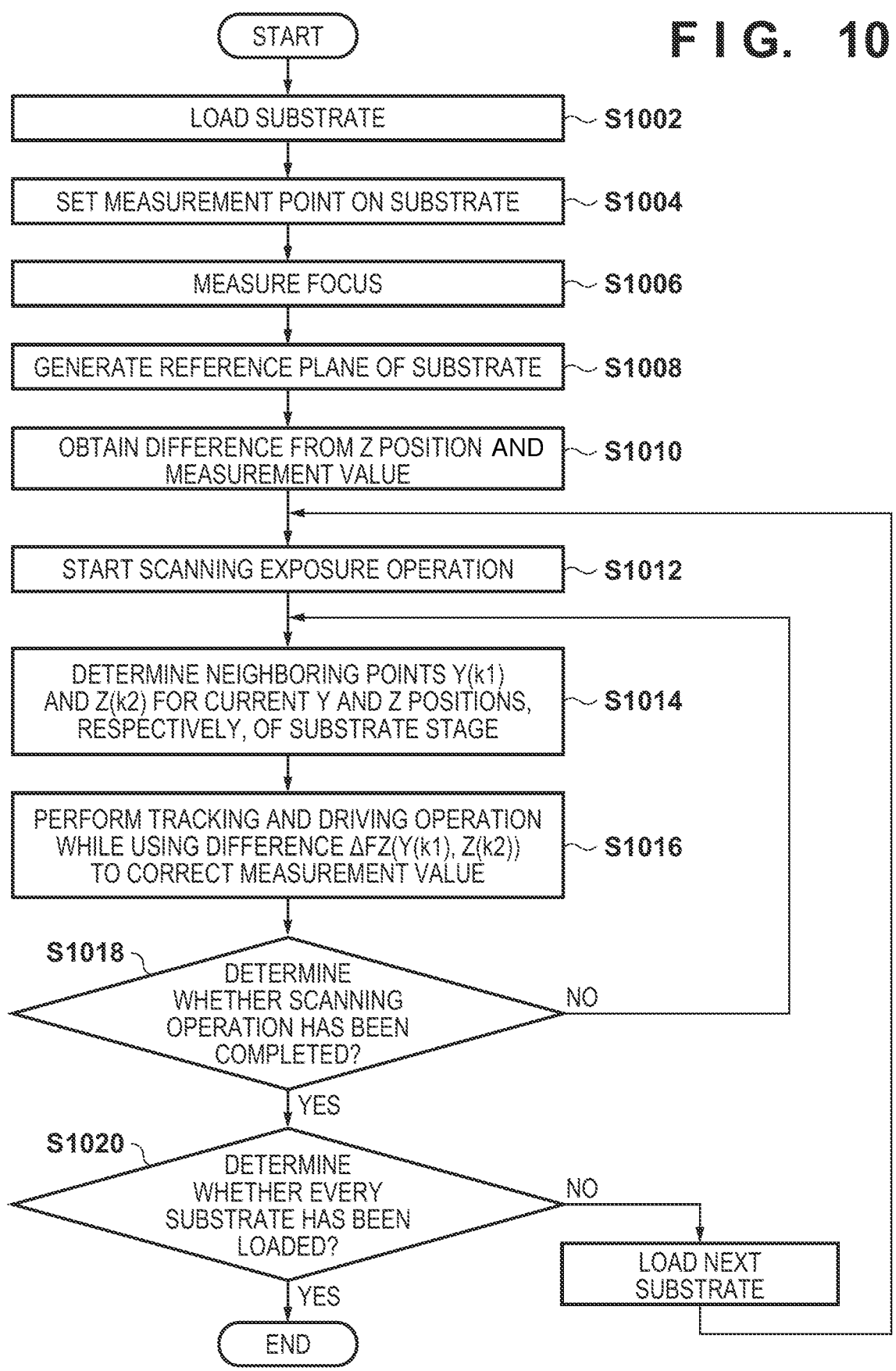
FIG. 10 is a flowchart for explaining the operation of the exposure apparatus shown in FIG. 1.

The operation of the exposure apparatus 100, more specifically, an operation performed from the loading of the substrate 5 until the completion of the scanning exposure operation will be described hereinafter with reference to FIG. 10. Before the start of scanning exposure operation in the exposure apparatus 100, a measurement offset value is determined by measuring the focus while scanning the substrate 5 for each of a plurality of positions in the Z direction.

In step S1002, the substrate 5 is loaded to the exposure apparatus 100, and the substrate stage 7 is made to hold the substrate 5. In step S1004, measurement points to be measured on the substrate are set in a focus measurement unit 30. More specifically, combinations of Y positions (Y(0), . . . , Y(N)) and Z positions (Z(0), . . . , Z(m)) are set as the measurement points on the substrate.

In step S1006, the focus measurement unit 30 measures the focus at each measurement point on the substrate set in step S1004 while scanning the substrate stage 7 as described above. As a result, the measurement value FZ of each measurement point on the substrate is obtained.

In step S1008, the reference plane of the substrate 5 is generated based on the measurement values FZ obtained in step S1006. In this embodiment, the reference plane of the substrate 5 is generated based on the measurement values of respective measurement points at each Z position near the imaging plane of the projection optical system 4. In step S1010, the difference $\Delta FZ$ between the Z position of the substrate stage 7 and each measurement value FZ obtained in step S1006 is obtained for each measurement point on the substrate.

In step S1012, the scanning exposure operation is started. In the scanning exposure operation, the focus measurement unit 30 obtains, while scanning the substrate stage 7 in the scanning direction, each measurement value by measuring the focus before each measurement point on the substrate reaches the exposure position. Subsequently, the substrate stage 7 is driven so that the Z position of the substrate stage 7 (substrate 5) will be positioned at the target position before each measurement point on the substrate reaches the exposure position (that is, the tracking and driving operation of sequentially adjusting and matching the reference plane of the substrate 5 with the imaging plane of the projection optical system 4 is performed).

In step S1014, neighboring points Y(k1) and Z(k2) are determined for the current Y and Z positions, respectively, of the substrate stage 7 at the time of the scanning exposure operation. Note that although the neighboring points Y(k1) and Z(k2) are determined in this embodiment, the current Y and Z positions of the substrate stage 7 may be obtained instead of determining the neighboring points Y(k1) and Z(k2).

In step S1016, the tracking and driving operation of the substrate stage 7 is performed while using the differences $\Delta FZ$ to correct the measurement values FZ obtained by the focus measurement unit 30 during the scanning exposure operation. More specifically, a difference $\Delta FZ(Y(k1), Z(k2))$ corresponding to the neighboring points Y(k1) and Z(k2) determined in step S1014 is selected among the differences $\Delta FZ$ obtained in step S1010. Subsequently, as described above, the tracking and driving operation of the substrate stage 7 is performed while using the difference $\Delta FZ(Y(k1), Z(k2))$ to correct a measurement value $FZ(Y(k1), Z(k2))$.

In step S1018, it is determined whether the scanning exposure operation performed on the substrate 5 has been completed. If it is determined that the scanning exposure operation on the substrate 5 has been completed, the process shifts to step S1020. On the other hand, if it is determined that the scanning exposure operation on the substrate 5 has not been completed, the process shifts to step S1014 to continue the scanning exposure operation.

In step S1020, it is determined whether every substrate 5 has been loaded to the exposure apparatus 100. If every substrate 5 has been loaded to the exposure apparatus 100, the operation ends. On the other hand, if every substrate 5 has not been loaded to the exposure apparatus 100, the process shifts to step S1022.

In step S1022, the next substrate 5 is loaded to the exposure apparatus 100, the substrate stage 7 is made to hold the substrate 5, and the process shifts to step S1012 to start the scanning exposure operation. In a case in which the scanning exposure operation is to be performed on a series of substrates (for example, substrates belonging to a single lot) that have undergone the same underlayer process, it can be considered that there is little variation between underlayers of the respective substrates. Hence, in this embodiment, the differences $\Delta FZ$ are obtained for the first substrate (for example, the first substrate in the lot) of the series of substrates, and the differences $\Delta FZ$ obtained for the first substrate will be used to correct the measurement value of each substrate other than the first substrate. In this case, the processing time can be reduced compared to a case in which the focus is measured and the difference $\Delta FZ$ is obtained for every substrate. However, even in a case in which a series of substrates that have undergone the same underlayer process are used, it may be arranged so that the focus will be measured and the difference $\Delta FZ$ will be obtained for every substrate (the process may shift from NO in step S1020 to step S1004).

Regarding the measurement points on the substrate, it is preferable to set the positions and the number of measurement points on the substrate in consideration of the time required for the processes and the influence on the accuracy. In addition, to further accurately control the tracking and driving operation of the substrate stage 7, it is possible to obtain an interpolation by using the positions and the differences $\Delta FZ$ of the respective measurement points to perform a polynomial interpolation of the first order or a polynomial interpolation of the second or higher order. In addition, the measurement points may be set from a larger number of positional combinations by increasing the axes about which the substrate stage 7 can be driven.

Regarding the focus measurement unit 30, it is preferable to obtain the difference $\Delta FZ$ for each of line sensors 17 in consideration of the characteristics of each of the line sensors 17. This will allow the differences $\Delta FZ$ to be obtained accurately even when the line sensors 17 have varying characteristics, and it will be possible to implement a highly accurate tracking and driving operation on the substrate stage 7.

Although this embodiment described a case in which the differences $\Delta FZ$ obtained from an arbitrary substrate are applied to a substrate having an identical thickness, the differences $\Delta FZ$ may be determined in consideration of the influence of the thickness of each substrate.

A method of manufacturing an article according to the embodiments of the present invention is suitable for manufacturing an article such as, for example, a device (a semiconductor element, an electromagnetic storage medium, a liquid crystal element, or the like), a color filter, an optical component, MEMS, or the like. The method of manufacturing the article includes a step of exposing a substrate coated with a photosensitive agent by the exposure method according to the embodiments described above by using the exposure apparatus 100 and a step of developing the exposed photosensitive agent. In addition, a circuit pattern is formed on the substrate by performing an etching step and an ion-implantation step on the substrate by using the developed photosensitive agent pattern as a mask. A circuit pattern made of a plurality of layers is formed on the substrate by repeating these steps of exposing, developing, etching, and the like. In a subsequent step, dicing (processing) is performed on the substrate on which the circuit pattern has been formed, and steps of mounting, bonding, and inspecting chips are performed. Furthermore, the method of manufacturing an article can include other known steps (oxidization, deposition, vapor deposition, doping, planarization, resist removal, and the like). The method of manufacturing an article according to the embodiments is superior to the method of the related art in at least one of the performance, quality, productivity, and production cost of an article.

The present invention is applicable to not only a step-and-scan exposure apparatus but also to a step-and-repeat exposure apparatus (stepper). A measurement method of measuring the surface shape of a substrate including a concave-convex portion also forms one aspect of the present invention. In the measurement method, for each of the plurality of positions in the height direction of a substrate, the measurement value of a position in the height direction of each measurement point on the substrate is obtained while moving the substrate in a direction perpendicular to the height direction. Subsequently, the surface shape of the substrate is obtained by specifying the position of the concave-convex portion present in the substrate based on the measurement values of the respective measurement points on the substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-111245 filed on Jun. 11, 2018, which is hereby incorporated by reference herein in its entirety.

What is claimed is:

1. An exposure method of exposing a substrate while moving an original and the substrate in a scanning direction, the method comprising:

performing a first step of obtaining, for each of a plurality of different height positions, a first measurement value of the height position of each of a plurality of measurement points on the substrate by causing a light beam to obliquely enter each of the plurality of measurement points on the substrate while moving the substrate in the scanning direction with the substrate positioned at each of the plurality of different height positions;

performing a second step of specifying, based on the first measurement value of each measurement point at each of the plurality of height positions obtained in the first step, a position of a concave-convex portion present in the substrate by obtaining a surface shape of the substrate;

performing a third step of driving the substrate, based on the position of the concave-convex portion specified in the second step and a second measurement value of the height position of each measurement point obtained by causing the light beam to obliquely enter each of the plurality of measurement points while moving the substrate in the scanning direction, so that the position in the height direction of the substrate will be a target position, when exposing the substrate; and performing a fourth step of obtaining, based on the first measurement value of each of the plurality of different height positions, an offset value of each measurement point for correcting a measurement error which occurs in the second measurement value due to the position of the concave-convex portion specified in the second step, wherein in the third step, one of the second measurement value and the target position is corrected by using, among the offset values, an offset value that corresponds to the height position of the substrate when the second measurement value is obtained.

2. The method according to claim 1, wherein in the fourth step, a difference between each of the plurality of different height positions and the first measurement value of each measurement point at each of the plurality of different height positions is obtained as the offset value.

3. The method according to claim 1, wherein in the third step, the substrate is driven, based on a difference between the second measurement value of each measurement point and the offset value of each measurement point corresponding to the height position of the substrate at the obtainment of the second measurement value, so that the height position of the substrate will be the target position.

4. The method according to claim 1, wherein in the third step, a difference between the target position and each measurement point corresponding to the height position of the substrate at the obtainment of the second measurement value is set as a new target position, and the substrate is driven so that that the height position of the substrate will be set at the new target position based on the second measurement value.

5. The method according to claim 1, wherein in the third step, the second measurement value of each measurement point is obtained before each of the plurality of measurement points reaches an exposure position, and the substrate is driven so that the height position of the substrate is set to the target position until each measurement point reaches the exposure position.

6. The method according to claim 1, wherein in a case in which a plurality of substrates are to be exposed, the first step, the second step, and the third step are performed for a first substrate among the plurality of substrates, and the third step is performed for substrates other than the first substrate among the plurality of substrates by using the height position of the concave-convex portion specified in the second step performed for the first substrate.

7. An exposure apparatus that exposes a substrate while moving an original and the substrate in a scanning direction, comprising:

a measurement unit configured to cause a light beam obliquely enter each of a plurality of measurement points on the substrate and obtain a measurement value of a height position of the substrate of each measurement point; and a control unit configured to control a process of exposing the substrate, wherein the control unit obtains, for each of a plurality of different height positions, a first measurement value of the height position of each of a plurality of measurement points on the substrate by causing the measurement unit to measure the plurality of measurement points on the substrate while moving the substrate in the scanning direction with the substrate positioned at each of the plurality of different height positions, specifies, based on the first measurement value of each measurement point at each of the obtained plurality of height positions, a position of a concave-convex portion present in the substrate by obtaining a surface shape of the substrate, and drives the substrate, based on the specified position of the concave-convex portion and a second measurement value of the height position of each measurement point obtained by causing the measurement unit to measure the plurality of measurement points while moving the substrate in the scanning direction, so that the height position of the substrate will be a target position, when exposing the substrate, wherein the control unit obtains, based on the first measurement value for each of the plurality of different height positions, an offset value of each measurement point for correcting a measurement error that occurs in the second height measurement value due to the position of the concave-convex portion, and corrects one of the second height measurement value and the target position by using, among the offset values, an offset value that corresponds to the height position of the substrate when the second measurement value is obtained.

8. The apparatus according to claim 7, wherein the measurement unit includes a plurality of sensors configured to detect light beams reflected by the plurality of measurement points, and the offset value is obtained for each of the plurality of sensors.

9. A method of manufacturing an article, comprising:

exposing a substrate by using an exposure apparatus;

developing the exposed substrate; and manufacturing the article from the developed substrate, wherein the exposure apparatus is an exposure apparatus that exposes the substrate while moving an original and the substrate in a scanning direction, including a measurement unit configured to cause a light beam obliquely enter each of a plurality of measurement points on the substrate and obtain a measurement value of a height position of the substrate of each measurement point, and a control unit configured to control a process of exposing the substrate, and the control unit obtains, for each of a plurality of different height positions, a first measurement value of the height position of each of a plurality of measurement points on the substrate by causing the measurement unit to measure the plurality of measurement points on the substrate while moving the substrate in the scanning direction with the substrate positioned at each of the plurality of different height positions, specifies, based on the first measurement value of each measurement point at each of the obtained plurality of height positions, a position of a concave-convex portion present in the substrate by obtaining a surface shape of the substrate, and drives the substrate, based on the specified height position of the concave-convex portion and a second measurement value of the height position each measurement point obtained by causing the measurement unit to measure the plurality of measurement points while moving the substrate in the scanning direction, so that the height position of the substrate will be a target position, when exposing the substrate, wherein the control unit obtains, based on the first measurement value for each of the plurality of different height positions, an offset value of each measurement point for correcting a measurement error that occurs in the second height measurement value due to the position of the concave-convex portion, and corrects one of the second height measurement value and the target position by using, among the offset values, an offset value that corresponds to the height position of the substrate when the second measurement value is obtained.

10. A measurement method of measuring a surface shape of a substrate including a concave-convex portion, the method comprising:

performing a first step of obtaining, for each of a plurality of different height positions, a first measurement value of the height position of each of a plurality of measurement points on the substrate by causing a light beam to be incident on each of the plurality of measurement points on the substrate while moving the substrate in a direction perpendicular to the height direction with the substrate positioned at each of the plurality of different height positions, performing a second step of specifying, based on the first measurement value of each measurement point at each of the plurality of height positions obtained in the first step, a position of a concave-convex portion present in the substrate by obtaining a surface shape of the substrate;

performing a third step of driving the substrate, based on the position of the concave-convex portion specified in the second step and a second measurement value of the height position of each measurement point obtained by causing the light beam to obliquely enter each of the plurality of measurement points while moving the substrate in the scanning direction, so that the position in the height direction of the substrate will be a target position, when exposing the substrate; and performing a fourth step of obtaining, based on the first measurement value of each of the plurality of different height positions, an offset value of each measurement point for correcting a measurement error which occurs in the second measurement value due to the position of the concave-convex portion specified in the second step, wherein in the third step, one of the second measurement value and the target position is corrected by using, among the offset values, an offset value that corresponds to the height position of the substrate when the second measurement value is obtained, and wherein, in the second step, the obtaining the surface shape of the substrate includes specifying a height position of the concave-convex portion based on the first measurement value of each measurement point at each of the plurality of height positions obtained in the first step.

* * * * *